United States Patent [19]
Damgaard et al.

[11] Patent Number: 6,005,443
[45] Date of Patent: Dec. 21, 1999

[54] PHASE LOCKED LOOP FREQUENCY SYNTHESIZER FOR MULTI-BAND APPLICATION

[75] Inventors: Morten Damgaard, Laguna Hills; Leo Li, Trabuco Canyon, both of Calif.

[73] Assignee: Conexant Systems, Inc., Newport Beach, Calif.

[21] Appl. No.: 09/044,281

[22] Filed: Mar. 19, 1998

[51] Int. Cl.[6] .............................. H03L 7/093; H03L 7/18; H03L 7/185
[52] U.S. Cl. ................................ 331/14; 331/16; 331/17; 331/25
[58] Field of Search .................................. 331/14, 17, 16, 331/25

[56] References Cited

U.S. PATENT DOCUMENTS 3,854,102  12/1974  Seipel et al. ............................... 331/25
3,882,424   5/1975  Debois et al. ............................. 331/23

*Primary Examiner*—Siegfried H. Grimm
*Attorney, Agent, or Firm*—Price, Gess & Ubell

[57] ABSTRACT

A frequency synthesizer for generating two or more output frequency ranges using a Phase Locked Loop (PLL) circuit having a single voltage-controlled oscillator (VCO). In a first embodiment, a frequency multiplier is connected to the output of the VCO. The output of the VCO and the output of the frequency multiplier are selectably fed back, depending upon which output frequency is desired. The output frequency may be taken directly from the VCO or the frequency multiplier. When the output frequency is taken from the output of the frequency multiplier, a control signal adjusts the gain of the phase detector and/or loop filter in order to compensate for the loop gain caused by the frequency multiplier. In a second embodiment, instead of adjusting the phase detector and/or loop filter gain, the values of the N and M dividers are adjusted. In a third embodiment, a frequency multiplier is connected to the output of the VCO and multiplies the output by a predetermined multiplier value. The N divider value is adjusted by a control signal, such that when the output is taken from the frequency multiplier, the ratio N/M is set equal to the predetermined multiplier value. In a fourth embodiment, the M value, the N value, the phase detector gain and the loop filter gain may all be adjusted in the circuit of the third embodiment, in order to keep the N/M ratio equal to the multiplier "H," and to compensate for the loop gain caused by changing the value of M. The technique described herein is useful for generating constant amplitude phase or frequency modulated signals like the radio signals defined for the GSM or DCS 1800 bands.

19 Claims, 6 Drawing Sheets

PHASE LOCKED LOOP FREQUENCY SYNTHESIZER FOR MULTI-BAND APPLICATION

BACKGROUND OF THE INVENTION

1. Field of the Invention

The present invention relates to a Phase Locked Loop (PLL) frequency synthesizer for multi-band applications and, more specifically, to a circuit that uses only one voltage-controlled oscillator (VCO), but generates two or more output frequency ranges.

2. Description of Related Art

FIG. 1 illustrates a standard Phase-Locked Loop (PLL) block diagram. The basic PLL has an input frequency $f_{in}2$ which is divided by a divider 4, wherein the divider 4 divides the input frequency $f_{in}2$ by a value N. The output of the divider 4 is then input into a phase detector 6. The phase detector 6 outputs a voltage that is proportional to a phase difference between two input frequencies. This phase detector output voltage is then input into a loop filter 8. The loop filter 8 smoothes the phase detector output voltage and determines the loop performance based upon selected loop filter values. The output of the loop filter 8 adjusts the voltage-controlled oscillator (VCO) 10 and determines the output frequency of the VCO 10. The output of the of the VCO 10 is then fed back as an input to the phase detector 6 via a feedback loop 14. The output voltage of the phase detector 6 will vary according to any change in the phase difference between the output frequency of the VCO 10 and the input frequency $f_{in}2$.

The feedback loop 14 thus provides a means of "locking" the phase of the output frequency $f_{out}12$ in accordance with the phase of the input frequency $f_{in}2$. If the input frequency $f_{in}2$ is a highly stable reference frequency, the PLL circuit produces a highly stable output frequency $f_{in}12$. The PLL circuit produces an output frequency $f_{out}12$, equal to the value $[f_{in}/N]$, wherein the phase of the VCO output frequency $f_{out}12$ follows the phase of the input frequency $f_{in}2$.

As illustrated in FIG. 2, a divider 16 may be used in the feedback loop 14 in order to change the output frequency $f_{out}12$. In this case, the output frequency $f_{out}12$ from the VCO 10 is equal to the value $[(f_{in} * M)/N]$. If the divider 16 is implemented using a programmable counter, the value of M can be changed. Thus, the output frequency $f_{out}12$ can be adjusted to a desired value by varying the value of "M."

Referring now to FIG. 3, an application of a PLL circuit is shown. A phase modulated intermediate input frequency (IF) 18 is input to the first divider 4 of the PLL circuit. The feedback loop 14 contains two additional blocks, however. A mixer 22 mixes a local oscillator signal $RF_{LO}26$ with the $RF_{OUT}$ signal 20 and the output of the mixer 22 is input into a bandpass (BP) filter 24. The output of the mixer may be referred to as the "feedback frequency." The feedback frequency can be selected from one of the numerous frequencies produced by the harmonic mixing. In general, the output of the mixer is equal to $[\pm n^*RF_{OUT} \pm m^*RF_{LO}]$. If n and m are "1," then the selected outputs of the mixer are either $RF_{out}$—$RF_{LO}$ or $RF_{LO}$—$RF_{OUT}$(assuming frequency down-conversion). The bandpass filter 24 removes any unwanted mixing products produced by the mixer 22 and determines which frequency is fed-back through the M divider 16. The operation of the remaining blocks operate as described in the previous figures. The PLL circuit translates i.e., moves) the frequency of the input IF 18 frequency to the VCO frequency with the same phase. Thus, by adjusting the value of the $R_{FLO}$ frequency 26, a desired output frequency $RF_{out}20$ can be produced for a given intermediate frequency (IF) 18.

In the following general equations, $f_{fb}$ is the feedback frequency output by the mixer, $f_{VCO}$ is the VCO frequency, and $f_{in}$ is the input frequency. The variables "n" and "m" are integer multipliers introuced by the harmonic mixing. These equations illustrate the operation of the circuit shown in FIG. 3.

$$f_{fb} = \pm n \cdot f_{VCO} \pm m \cdot f_{LO} \Rightarrow f_{VCO} = \pm \frac{1}{n} f_{fb} \pm \frac{m}{n} f_{LO}$$

$$f_{fb}/M = f_{in}/N$$

$$f_{fb} = f_{in} \cdot \frac{M}{N}$$

$$f_{OUT} = f_{VCO} = \pm f_{in} \cdot \frac{M}{N} \cdot \frac{1}{n} \pm \frac{m}{n} \cdot f_{LO}$$

Assuming "n" and "m" are 1, the equation becomes $$\boxed{f_{OUT} = f_{VCO} = \pm f_{in} \cdot \frac{M}{N} \pm \cdot f_{LO}}$$

For applications that require two different $RF_{out}$ frequency bands, such as a dual-band cellular telephone, a second PLL circuit would normally be required. For example, in a GSM/DCS 1800 dual-band cellular telephone, the transmit frequency bands are 890 –915 MHz for the GSM band and 1710 –1785 MHz for the DCS 1800 band. This would require using two separate VCOs, which adds complexity and expense to the over-all system design. Thus, it would be desirable to have a PLL circuit which could generate two different output frequency bands, while using only one VCO.

OBJECTS AND SUMMARY OF THE INVENTION

It is thus a first object of the present invention to provide a circuit which will generate at least two distinct output frequencies, while utilizing only one VCO.

It is a second object of the present invention to provide a circuit capable of generating at least two distinct output frequency ranges while utilizing a single mixer.

It is a third object of the present invention to provide a circuit which will operate efficiently in a GSM/DCS1800 dual-band cellular telephone.

These and other objects may be met by a first embodiment of the present invention, wherein a frequency multiplier (or divider) is connected to the output of the VCO in a standard PLL circuit. The output of the VCO and the output of the frequency multiplier are selectably fed-back, depending upon which output frequency is desired. An output frequency may be taken directly from the VCO or the frequency multiplier. When the output frequency is taken from the output of the frequency multiplier, the output of the frequency multiplier is fed back and a control signal adjusts the gain of the phase detector and/or the loop filter in order to compensate for the loop gain caused by the frequency multiplier. Additional frequency multipliers or dividers may be added to provide for multi-band operation. However, the phase detector and/or loop filter gain must be adjusted accordingly to compensate for the loop gain of the circuit.

In a second embodiment, instead of adjusting the phase detector and/or loop filter gain, as in the first embodiment, the values of the N and M dividers are adjusted.

In a third embodiment of the present invention, a frequency multiplier (or divider) block is connected to the output of the VCO. The frequency multiplier multiplies the output of the VCO by a multiplier value "H." The output of the multiplier is not fed-back, however. Additional multipliers can be added as desired, and a desired output selected via a control signal. The N divider value is adjusted by a control signal, such that when the output frequency is taken from the output of the frequency multiplier, the ratio N/M is set equal to the value "H." This architecture keeps the modulation index equal at the input and the output of the loop.

In a forth embodiment, the M value, the N value, the phase detector gain and the loop filter gain may all be adjusted, in order to keep the N/M ratio equal to the multiplier "H" and to compensate for the loop gain caused by changing the value of M. The fourth embodiment is advantageous for design situations in which the third embodiment is inadequate to cover the desired frequency ranges. The N and M dividers can be made programmable to allow for easy adjustment of the N/M ratio and to allow for multi-band operation.

BRIEF DESCRIION OF THE DRAWINGS

The exact nature of this invention, as well as its objects and advantages, will become readily apparent from consideration of the following specification as illustrated in the accompanying drawings, in which like reference numerals designate like parts throughout the figures thereof, and wherein.

DETAILED DESCRIPTION OF THE PREFERRED EMBODIMENTS

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a circuit that uses only one voltage-controlled oscillator (VCO), but generates two different output frequency ranges.

Figure 1:
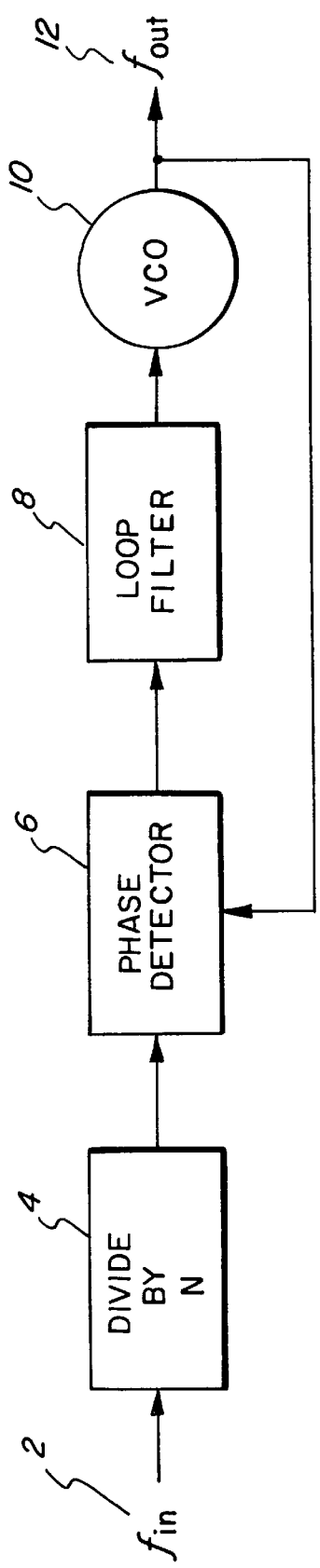
FIG. 1 is a block diagram showing a basic Phase-Locked Loop (PLL)
Figure 2:
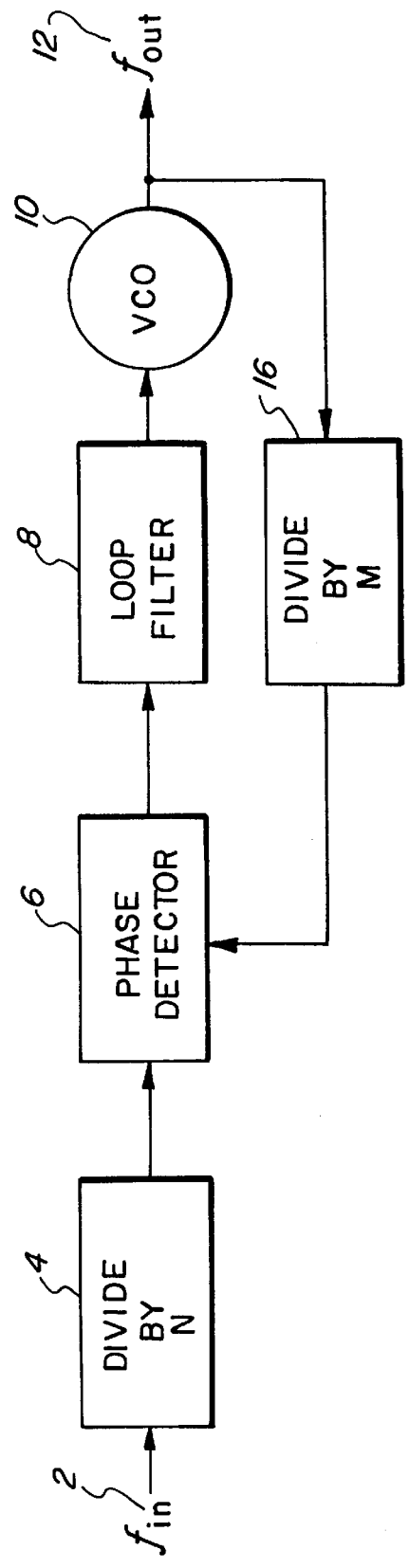
FIG. 2 is a block diagram of a PLL frequency synthesizer utilizing a program counter in the feedback loop.
Figure 3:
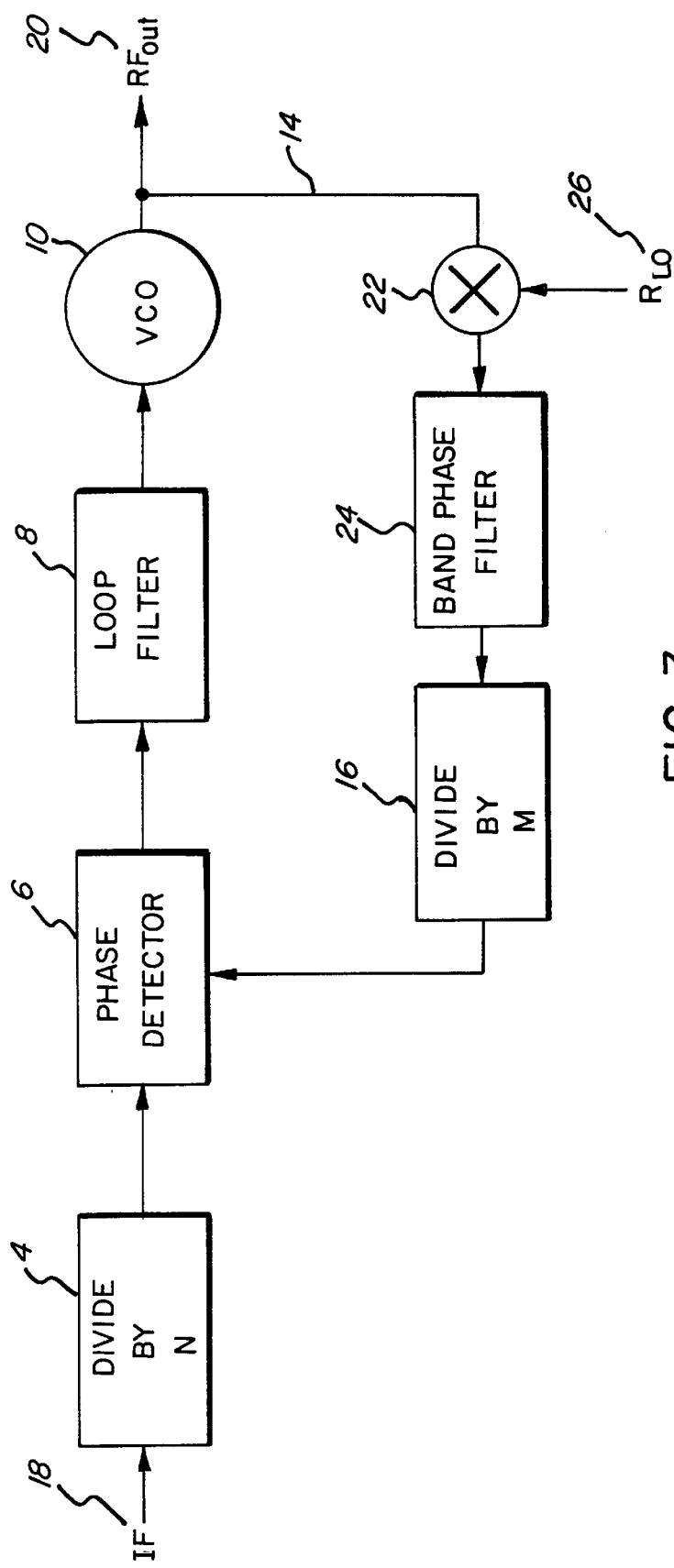
FIG. 3 is a block diagram of a PLL wherein the feedback loop contains a mixer.
Figure 4:
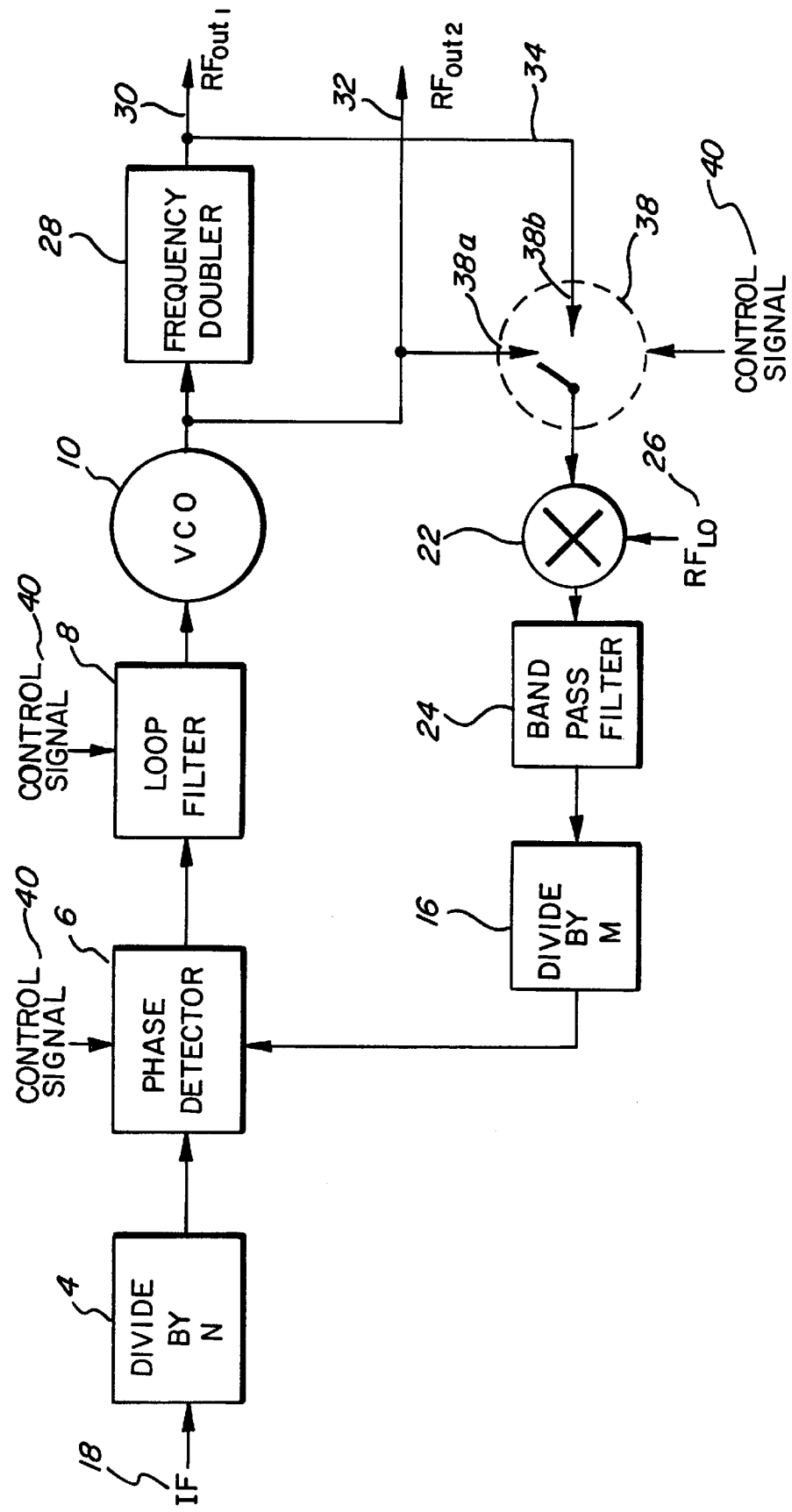
FIG. 4 is a block diagram of a PLL according to a first embodiment of the present invention, wherein a frequency doubler and a band-switch are used to provide two different output frequency ranges.

The present invention will now be described with reference to FIG. 4. The PLL block diagram operates generally as described in FIG. 3. However, the present invention adds two additional components to the basic circuit, a frequency doubler 28 and a band-switch 38. When the band-switch 38 is connected directly to the output of the VCO 10 (i.e. the band-switch 38 is in position "38a"), the circuit operates as described above with reference to FIG. 3. That is, $$f_{OUT} = f_{VCO} = \pm f_{in} \cdot \frac{M}{N} \pm f_{LO}.$$

When the band-switch 38 is in position "38b," the operation of the PLL circuit is quite different, however. Instead of the output of the VCO 10 being fed back into the mixer 22, the output of the frequency doubler 28 is fed back. The frequency doubler 28 doubles the input frequency supplied by the VCO 10 and outputs a frequency signal RF$_{OUT1}$ 30. While the operation of the presently preferred embodiment is illustrated and described using a frequency doubler, the principles of the present invention may be implemented with any frequency multiplier (or divider) without departing from the teachings herein. For example, the frequency doubler 28 could actually divide the VCO output frequency by 2, or could triple the frequency supplied by the VCO 10. It should be noted that the term "multiplier" as used herein encompasses a divider, since multiplying by ½ is equivalent to dividing by 2.

This circuit is defined by the following equations, wherein H is the multiplier value.

$$f_{OUT} = H \cdot f_{VCO}$$

$$f_{OUT} = \pm f_{in} \frac{M}{N} \cdot \frac{1}{n} \pm \frac{m}{n} \cdot f_{LO}$$

TO PRESERVE MODULATION INDEX :
$$\frac{M}{N \cdot n} = 1$$
(Independent of $H$)

Notice that the modulation index is independent of the multiplier value H. Thus, by setting the values of the input IF frequency 18, the VCO 10, and the mixer input frequency RF$_{LO}$ 26 as desired, two distinct frequency ranges may be output by the PLL circuit, using only a single VCO 10. Another advantage to using this approach is that there is no need to adjust the N/M ratio, so that the dividers 4, 16 do not need to be programmable.

If the frequency doubler 28 is used, however, the loop gain of the PLL circuit doubles, assuming that the M divider 16 value is kept constant. If the value of M was changed to compensate for the loop gain, the phase relationship between the input and output frequencies would also change. Thus, there is a need to compensate for the loop gain of the circuit when the band-switch 38 is connected to the frequency doubler 28 output. This problem may be solved by either having a loop filter 8 with a selectable gain, a phase detector 6 with a selectable gain, or by having both a loop filter 8 and a phase detector 6 with a selectable gain. A control signal line 40 is input to the band-switch 36, the phase detector 6 and/or the loop filter 8. When the control signal on the control signal line 40 places the band-switch 38 into position "38a," the gain of the phase detector 6 and/or the loop filter 8 are set to the required values for taking the output directly from the VCO 10. When the band-switch 38 is set to position "38b" by the control signal on the control signal line 40, the gain of the phase detector 6 and/or the loop filter 8 is set to the required value for taking the output from the frequency doubler 28. Thus, a single control line can be used to adjust the PLL circuit to generate two distinct output frequency ranges using only a single VCO.

Using the GSM/DCS 1800 dual-band cellular telephone as an example, the VCO can be designed to output the frequency range 855–915 MHz. Taking the output frequency directly from the VCO provides the necessary frequency range for the GSM transmit band (890–915 MHz). Switching the band-switch 38 to position "38b" doubles the output frequency, and provides the frequencies of 1710–1785 MHz required for the DCS 1800 transmit band.

Figure 5:
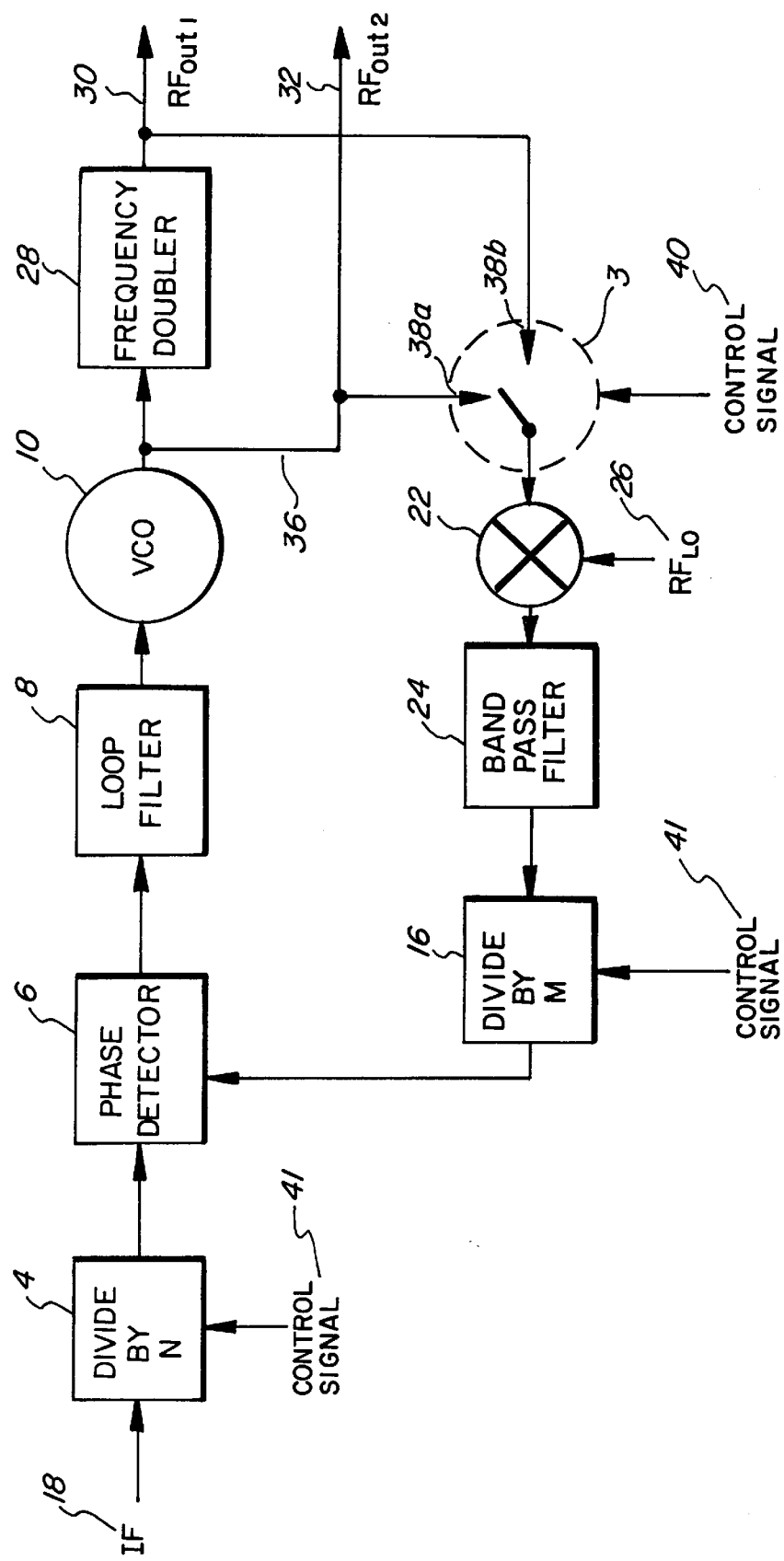
FIG. 5 is a block diagram of a PLL according to a second embodiment of the present invention.

FIG. 5 illustrates a second embodiment of the present invention. In the first embodiment it is assumed that the M value is kept constant. However, the value of M may be adjusted in order to compensate for the loop gain. If M is adjusted, though, the value of N also must also be adjusted in order to output the desired frequency. In FIG. 5, a control signal on the control signal line 41 adjusts the values of N and M, as required. Additionally, the gain of the phase detector and/or loop filter may also be adjusted if necessary (not shown).

Figure 6:
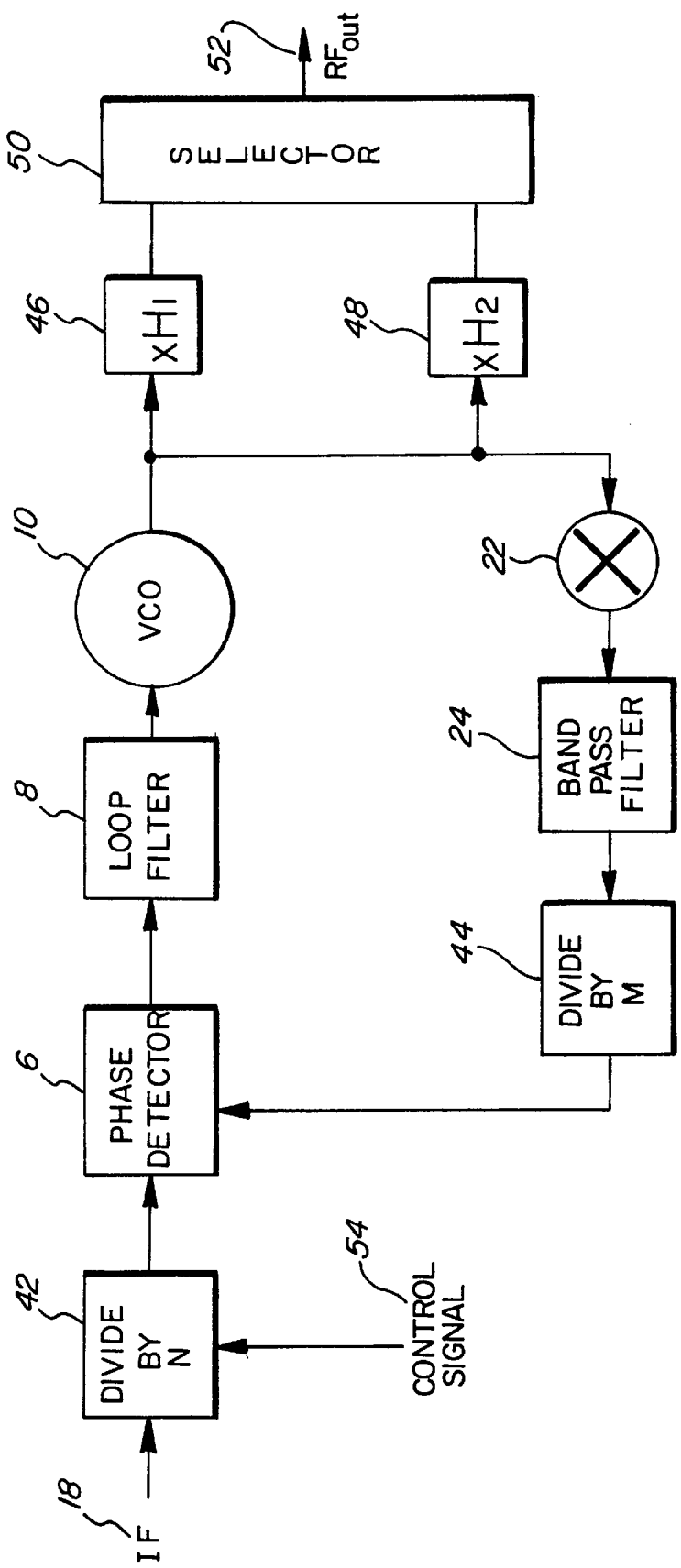
FIG. 6 is a block diagram of a PLL according to a third embodiment of the present invention, wherein multiplier blocks and a selector are incorporated outside of the feedback loop.

Referring again to FIG. 3, a well-known prior art method for generating a constant envelope modulated signal is shown. A Phase Locked Loop (PLL) circuit has a modulated IF signal input as the reference input to the phase detector 6. By modifying this architecture, as shown in FIG. 6, a modulated signal can be generated which is equal to $H * f_c$, wherein $f_c$ is the output frequency of the VCO. In order for this method to work correctly, however, the N/M ratio must be equal to the multiplication factor "H" applied to the VCO output frequency. This design requirement keeps the modulation index (and the modulation bandwidth) equal at the input and output of the loop. Consider the following equations:

$$f_{fb} = \pm n \cdot f_{VCO} \pm m \cdot f_{LO} \Rightarrow f_{VCO} = \pm \frac{1}{n} f_{fb} \pm \frac{m}{n} f_{LO}$$

$$f_{fb} / M = f_{in} / N$$

$$f_{fb} = f_{in} \cdot \frac{M}{N}$$

$$f_{VCO} = \pm f_{in} \cdot \frac{M}{N} \cdot \frac{1}{n} \pm \frac{m}{n} \cdot f_{LO}$$

$$f_{oit} = H \cdot f_{VCO} = \pm \frac{M \cdot H}{N \cdot n} f_{in} \pm \frac{mH}{n} \cdot f_{LO}$$

TO PRESERVE MODULATION INDEX :
$$\frac{M \cdot H}{N \cdot n} = 1$$

Assuming "n" is equal to 1, the divider ratio N/M must equal H in order to preserve the modulation index.

In FIG. 6, a third embodiment of the present invention is shown. The output of the VCO 10 is fed back to the mixer 22, and loop operates as described with reference to FIG. 3. The output of the VCO 10 is also input to two multiplier blocks 46, 48, however. The multiplier blocks 46, 48 multiply the output of the VCO 10 by the values "$H_1$," and "$H_2$". For example, if the VCO 10 is adjustable to cover the frequency range 855–915 MHz, $H_1$ can be set equal to "1" and $H_2$ equal to "2". If the output is taken from the $H_1$ 46 block, the GSM band (890–915 MHz) can be covered. If the output is taken from the $H_2$ 48 block, the DCS1800 band (1710–1785 MHz) can be covered. A control signal line 54 controls an output selector 50 in order to output the desired frequency.

The control signal line 54 also adjusts the value of N, according to which output frequency is selected, in order to keep the N/M ratio equal to the multiplier H. Notice that it is desirable to keep the M value constant, in order not to change the loop gain of the circuit. Therefore, it is preferable to adjust only the N value. However, it is not always possible to adjust only the N value and still cover the desired frequency ranges.

Figure 7:
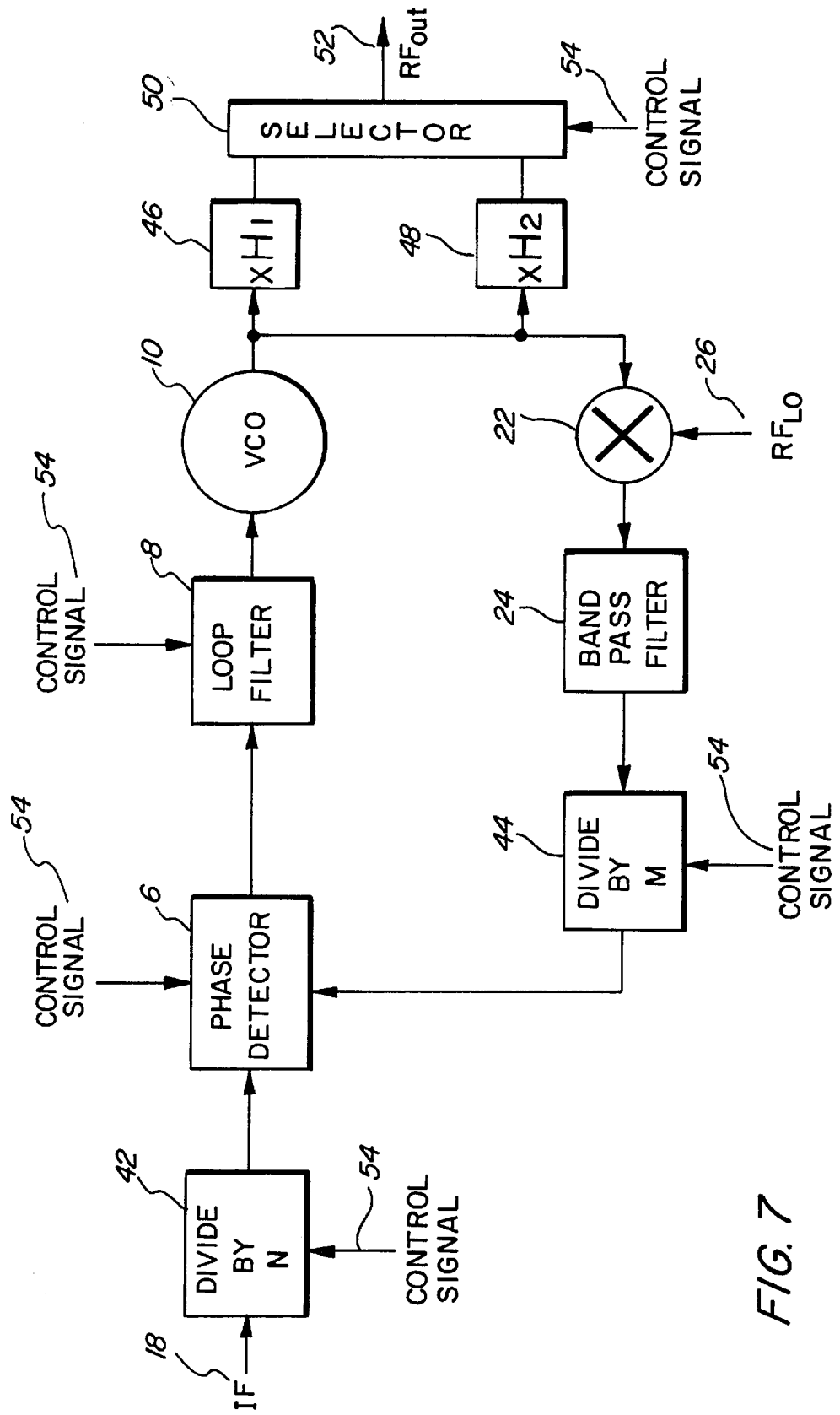
FIG. 7 is a block diagram of a PLL according to a fourth embodiment of the present invention.

FIG. 7 illustrates a fourth embodiment of the present invention. This embodiment is similar to the embodiment of FIG. 6, except that the value of M is adjustable, as well as the value of N. This allows for greater flexibility in designing the circuit to cover desired output frequency ranges. If the value of M is adjusted, however, the loop gain changes. Therefore, in order to compensate for the loop gain, the gain of the phase detector 6 and/or the loop filter 8 are also adjusted.

The main advantage of this architecture over the prior art is that only one VCO is required in order to cover two (or more) frequency bands. Also, the mixer in the loop always has the same input frequency range, allowing the mixer to be optimized for a given application. By controlling the divider ratio N/M so that N/M=H, the modulation of input IF can remain unchanged, when the modulation is identical for the two bands (as it is in the present case for the GSM/DCS1800 bands). The N and M dividers can be made programmable to allow for easy adjustment of the N/M ratio, and to allow for multi-band operation.

Those skilled in the art will appreciate that various adaptations and modifications of the just-described preferred embodiments can be configured without departing from the scope and spirit of the invention. Therefore, it is to be understood that within the scope of the appended claims, the invention may be practiced other than as specifically described herein.

What is claimed is:

1. A Phase Locked Loop (PLL) circuit for generating two or more output frequency ranges, the circuit comprising:

a first divider for dividing an input frequency signal by a value N;

a phase detector having a selectable gain control, the phase detector connected to an output of the first divider, a loop filter connected to an output of the phase detector;

a voltage-controlled oscillator (VCO) connected to an output of the loop filter;

a frequency multiplier connected to an output of the VCO;

a band-switch having a first input connected to the output of the VCO, a second input connected to an output of the frequency multiplier and an output which is selectably connected to either the first or second input;

a mixer having two inputs, one mixer input connected to the output of the band-switch and a second mixer input connected to a radio frequency signal;

a second divider for dividing a frequency by a value M, the second divider connected to an output of the mixer, an output of the second divider being connected to an input of the phase detector; and a control signal line connected to the band-switch and the phase detector, wherein when a control signal on the control signal line selects a desired output for the band-switch, the selectable gain of the phase detector being set accordingly.

2. The circuit of claim 1 filter comprising a loop filter having a selectable gain set by the control signal on the control signal line.

3. The circuit of claim 2, wherein both the loop filter gain and the phase detector gain are set by the control signal on the control signal line.

4. The circuit of claim 3, wherein a bandpass filter is connected between the mixer and the second divider.

5. The circuit of claim 4, wherein the frequency multiplier is a frequency doubler and the selectable gain of the loop filter or the phase detector has two settings, one corresponding to the output of the band-switch being connected to the output of the VCO and a second setting corresponding to the output of the band-switch being connected to the output of the frequency doubler.

6. The circuit of claim 5, wherein the VCO outputs a frequency range of 855–915MHz.

7. The circuit of claim 1, wherein the N and M divider values are adjusted by a control signal on the control signal line.

8. A method for generating two or more output frequency ranges from a phase locked loop (PLL) circuit having a phase detector, a loop filter, and a single voltage-controlled oscillator (VCO), the method comprising the steps of:

multiplying an output of the VCO by a predetermined value to produce a multiplied output;

selecting a desired output frequency;

selectably feeding back to the phase detector either the output of the VCO or the multiplied output, based upon the selected desired output frequency, wherein when the output of the VCO is selected, the output of the VCO is fed back, and when the multiplied output is selected, the multiplied output is fed back; and setting a gain control of the phase detector or the loop filter to a predetermined amount, wherein the gain control is set according to the selected output frequency.

9. The method of claim 8, wherein the step of setting comprises setting a gain control of both the phase detector and the loop filter.

10. The method of claim 8, further comprising the step of adjusting the values of N and M [are adjusted] according to the selected output frequency.

11. The method of claim 9, wherein the step of multiplying further comprises multiplying the output of the VCO by a plurality of predetermined values and the step of selectably feeding back comprises feeding back to the phase detector either the output of the VCO or one of the plurality of multiplied outputs, based upon the selected desired output frequency.

12. A Phase Locked Loop (PLL) circuit for generating two or more output frequency ranges, the circuit comprising:

a first divider for dividing an input frequency signal by a value N, wherein the value of N is adjustable;

a phase detector connected to an output of the first divider;

a loop filter connected to an output of the phase detector;

a voltage-controlled oscillator (VCO) connected to an output of the loop filter;

one or more frequency multipliers connected to an output of the VCO;

a mixer having two inputs, one mixer input connected to the output of the VCO and a second mixer input connected to a local oscillator signal;

a second divider for dividing a frequency by a value M connected to an output of the mixer, an output of the second divider being connected to an input of the phase detector;

a selector connected to the output of the one or more frequency multipliers for selecting an output frequency; and a control signal line connected to the selector and the first divider wherein the control signal line adjusts the value of N such that the ratio N/M equals a multiplier value associated with the selected output frequency.

13. The circuit of claim 12, wherein the control signal line is connected to the second divider, the phase detector and the loop filter; and the value of M, the gain of the phase detector and/or the gain of the loop filter are adjusted according to the selected output frequency.

14. The circuit of claim 12, wherein a bandpass filter is connected between the mixer and the second divider.

15. The circuit of claim 12, wherein only one frequency multiplier is connected to the output of the VCO, and the selector selects between the output of the VCO and the output of the frequency multiplier.

16. The circuit of claim 15, wherein the frequency multiplier is a frequency doubler, and the VCO outputs a frequency range of 855 –915 MHz.

17. A method for generating two or more output frequency ranges from a Phase Locked Loop PLL) circuit having a single voltage controlled oscillator (VCO), an adjustable first divider which divides by a value N, a second divider which divides by a value M connected as inouts to a phase detector which is connected to a loop filter, the method comprises the steps of:

multiplying an output of the VCO by a predetermined value to produce a multiplied output frequency;

selecting a desired output frequency of either the VCO output or the multiplied output frequency; and adjusting the values of the first divider such that the ratio N/M equals the value of the predetermined value when the multiplied output is selected, and adjusting the ratio N/M equal to the value "1" when the VCO output is selected.

18. The method of claim 17, wherein the step of adjusting further comprises adjusting the value of M, a gain of the phase detector and/or a gain of the loop filter.

19. The method of claim 17, wherein the step of multiplying further comprises multiplying the output of the VCO by a plurality of predetermined values and the step of selecting further comprises selecting the VCO output or one of the plurality of multiplied output frequencies and the step of adjusting further comprises adjusting the ratio N/M equal the predetermined value corresponding to the selected output frequency.

* * * * *